US007859421B2

(12) United States Patent
Berthold et al.

(10) Patent No.: US 7,859,421 B2
(45) Date of Patent: Dec. 28, 2010

(54) CIRCUIT AND METHOD FOR DETECTING A VOLTAGE CHANGE

(75) Inventors: Joerg Berthold, Munich (DE); Christian Pacha, Munich (DE); Artur Wroblewski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 12/361,259

(22) Filed: Jan. 28, 2009

(65) Prior Publication Data

US 2009/0189702 A1 Jul. 30, 2009

(30) Foreign Application Priority Data

Jan. 28, 2008 (DE) .................. 10 2008 006 301

(51) Int. Cl.
*G08B 21/00* (2006.01)
*H03B 1/00* (2006.01)
*H03B 5/24* (2006.01)
*H03K 3/03* (2006.01)

(52) U.S. Cl. .................. 340/653; 340/660; 331/46; 331/57; 331/64; 331/173

(58) Field of Classification Search .................. 340/540, 340/635, 653, 657, 660–663; 331/46, 57, 331/64, 74, 75, 173
See application file for complete search history.

(56) References Cited

U.S. PATENT DOCUMENTS 3,737,754 A 6/1973 Katz
7,733,189 B1 * 6/2010 Bennett .................. 331/64

FOREIGN PATENT DOCUMENTS

DE 2213281 9/1972

* cited by examiner

*Primary Examiner*—David Mis
(74) *Attorney, Agent, or Firm*—Dickstein Shapiro LLP (57) ABSTRACT

A circuit arrangement for detecting voltage changes, comprising supply terminals configured to apply a first potential and a second potential, a first oscillator and a second oscillator, which are operated with the first potential and the second potential, a voltage dependence of the frequency of the first oscillator differing from a voltage dependence of the frequency of the second oscillator, a first evaluation circuit configured to evaluate the frequency of the first oscillator and a second evaluation circuit configured to evaluate the frequency of the second oscillator, and a comparison circuit configured to compare a value based on the evaluated frequencies of the first oscillator and of the second oscillator with a predetermined threshold value, and to output a voltage change signal indicating an impermissible voltage change between the first potential and the second potential depending on the result of the comparison.

25 Claims, 8 Drawing Sheets

CIRCUIT AND METHOD FOR DETECTING A VOLTAGE CHANGE

CROSS-REFERENCE TO RELATED APPLICATION

This application claims priority to German Patent Application Serial No. 10 2008 006 301.0, filed Jan. 28, 2008, and which is incorporated herein by reference in its entirety.

TECHNICAL FIELD

The application relates to a circuit arrangement for detecting voltage changes and a method for detecting a voltage change.

BACKGROUND

Circuits in security-relevant applications are constantly exposed to attacks aimed at spying out secret information or impairing the function of the circuit. One attack consists, for example, in the analysis of the power consumption in the circuit. By means of static power analysis (SPA) or differential power analysis (DPA), secret information such as cryptographic keys, for example, can be determined from the power consumption. One countermeasure involves using dual rail circuit technologies in which the power consumption is independent of the data.

A further attack consists in altering the sequence of the circuit by means of a disturbance, such as by momentarily lowering the supply voltage, for example. As a result of the erroneous function of the circuit, in the course of the subsequent cycles it is possible to draw conclusions about the data or algorithms processed in the circuit. One countermeasure consists in providing backup capacitances within the circuit. The circuit can then continue to be operated with a sufficient supply voltage and, at least upon the next clock edge, a reset signal can be triggered which leads the circuit into a predetermined state. The dimensioning of such a backup capacitance will be explained on the basis of the following example. In a circuit having a clock frequency of $f=30$ MHz, for example, and a current consumption of $I=20$ mA, on average a charge of $Q=I/f=20\times10^{-3}/30\times10^{6}=0.66$ nC is moved per cycle. At an operating voltage of 1.2 volts, therefore, a circuit-inherent capacitance of $C=Q/U=0.66$ nC/1.2 V=0.55 nF, formed by gate, junction and wiring capacitances, is subjected to charge reversal. In circuits constructed using modern technology, a lowering of the supply voltage by 5% leads to an increase of 10% in propagation delay. In other words, if the propagation delay is intended to increase by not more than 10%, the supply voltage is permitted to fall by not more than 5%. In order to be able to provide the necessary charge for a cycle despite a voltage reduction of 5%, the backup capacitor must still be charged with at least 95% after providing the charge in order that the supply voltage, which is proportional to the charge, decreases by not more than 5%. The backup capacitor must therefore have twenty times the capacitance of the circuit capacitance to be subjected to charge reversal, such that a backup capacitance of $20\times0.55$ nF=11 nF is required. The corresponding number of capacitance cells have to be integrated into the circuit in order to achieve the required backup capacitance, which increases the area requirement of the circuit and leads to higher costs.

A further measure to counter the momentary lowering of the supply voltage consists in the voltage changes being detected and a reset operation of the circuit subsequently being triggered. One challenge here is that voltage changes with time constants that are much shorter than the system clock of the circuit can be detected only with difficulty.

BRIEF DESCRIPTION OF THE DRAWINGS

The invention is described in more detail below on the basis of exemplary embodiments with reference to drawings.

In the figures.

DETAILED DESCRIPTION

The application provides a circuit arrangement for detecting voltage changes, comprising: supply terminals configured to apply a first potential and a second potential, a first oscillator and a second oscillator, which are operated with the first potential and the second potential, a voltage dependence of the frequency of the first oscillator differing from a voltage dependence of the frequency of the second oscillator, a first evaluation circuit configured to evaluate the frequency of the first oscillator and a second evaluation circuit configured to evaluate the frequency of the second oscillator, and a comparison circuit configured to compare a value based on the evaluated frequencies of the first oscillator and of the second oscillator with a predetermined value and to output a voltage change signal indicating an impermissible voltage change between the first potential and the second potential depending on the result of the comparison. As a result of the different voltage dependencies of the frequencies of the first oscillator and of the second oscillator, voltage changes between the first potential and the second potential have different effects on the frequencies of the oscillators. The frequencies are evaluated and if the voltage changes are impermissibly large, then a signal indicating the voltage change is output by the comparison circuit.

The application furthermore provides a method for detecting a voltage change, comprising generating a first and a second frequency from a voltage, wherein the first frequency has a lower voltage dependence than the second frequency, evaluating the first frequency and the second frequency, and outputting a voltage change signal if the evaluated first frequency and the evaluated second frequency differ from one another by more than a predetermined threshold value, or the evaluated second frequency lies below a predetermined threshold value after a time predetermined by the evaluated first frequency.

In an embodiment, the first oscillator has voltage stabilization circuits via which the first oscillator is connected to the first potential and the second potential. The voltage stabilization circuits are designed such that voltage changes between the first potential and the second potential affect the frequency of the first oscillator only to a reduced extent in comparison with the frequency of the second oscillator. The frequency of the first oscillator can therefore be used as a reference for the comparison with the frequency of the second oscillator.

In another embodiment, each of the voltage stabilization circuits comprises a stabilization capacitor and a stabilization resistor connected in parallel. The stabilization capacitors and the stabilization resistors are dimensioned such that momentary disturbances of the voltage between the first potential and the second potential are not forwarded to the first oscillator. The voltage stabilization circuit therefore acts like a low-pass filter for the voltage disturbances.

In another embodiment, the stabilization capacitors are formed by at least one gate structure of a transistor. Connecting the gate structures in parallel leads to a higher capacitance, while a series circuit increases the dielectric strength. It goes without saying that the gate structures can also be connected in parallel and in series in combined manner. As a result of the embodiment of the stabilization capacitors as gate structures, these can be concomitantly integrated into the circuit arrangement in a space-saving manner.

In another embodiment, the stabilization resistors are formed by at least one controlled path of a transistor. The transistors can be connected in parallel in order to enable a higher current conductivity, or in series in order to obtain higher resistance values. In a similar manner to the stabilization capacitors, they can be concomitantly integrated into the circuit arrangement in a space-saving manner.

In another embodiment, the second oscillator is directly connected to the first potential and the second potential. In contrast to the first oscillator, which is protected against voltage changes between the first potential and the second potential by means of the voltage stabilization circuits, said voltage changes are forwarded directly to the second oscillator. The second oscillator can therefore serve as a sensor for voltage changes between the first potential and the second potential.

In another embodiment, the first oscillator and the second oscillator are constructed with the same components apart from the voltage stabilization circuits. They therefore have approximately identical frequencies given a constant first potential and a constant second potential. By determining the difference between the frequencies, it is possible to determine relatively easily whether voltage changes are present.

In another embodiment, each of the first oscillator and the second oscillators comprise ring oscillators having a feedback series circuit comprising an odd number of inverting gates. Ring oscillators have the advantage that they can be constructed without capacitors, coils or crystals and are compact. In addition, inverting gates can easily be monolithically integrated.

In another embodiment, the inverting gates of the first oscillator and the inverting gates of the second oscillator are arranged in direct spatial proximity. As a result of the spatial arrangement, the oscillators are exposed to identical ambient conditions, such as the temperature, for example. The ambient conditions therefore affect the frequency of the first oscillator and of the second oscillator in the same way.

In another embodiment, the inverting gates of the first oscillator and of the second oscillator are manufactured in the same production process. In this case, it is advantageous that fluctuations in the production process do not result in different voltage dependencies or propagation delays of the inverting gates. The influence of production process fluctuations on the frequencies of the first and of the second oscillator is therefore minimized.

In another embodiment, the first evaluation circuit is a first counter and the second evaluation circuit is a second counter. The first counter outputs a first counter reading and the second counter outputs a second counter reading. Counters permit simple and highly accurate determination of the frequency of the first and of the second oscillator and can easily be monolithically integrated. By way of the first and the second counter reading, it is possible to derive statements about the voltage change between the first and the second potential.

In another embodiment, the circuit arrangement comprises a further circuit, which is clocked with a system clock, is operated with the same first potential and the same second potential as the circuit arrangement, and is put into a predetermined state when the voltage change signal is output by the circuit arrangement. Since the circuit and the circuit arrangement are supplied with the same voltage, the voltage for the circuit can be monitored by means of the circuit arrangement. Depending on the comparison with a threshold value, it is possible, depending on the magnitude of the voltage change, for the circuit to continue to be operated or to be put into a predetermined state.

In another embodiment, the predetermined state of the circuit is a reset state, an initialization state or an inhibit state. With the predetermined state, the function of the circuit is set or frozen in a known state, thereby making it more difficult to draw conclusions about data or algorithms that might be possible as a result of the erroneous function of the circuit on account of the voltage changes.

In another embodiment, the frequency of the first oscillator is at least eight times greater than the frequency of the system clock of the circuit. The higher the frequency of the first oscillator relative to the frequency of the system clock, the more rapidly and the more finely it is possible to identify voltage changes between the first potential and the second potential. In this way, rapid reaction to voltage changes is possible, by means of which the circuit can be protected against manipulation.

In another embodiment, the comparison circuit has a subtractor configured to calculate a difference between the counter reading of the first counter and the counter reading of the second counter. By forming the difference between the counter readings, the differences in the frequencies of the first and of the second oscillator and therefore also the voltage change between the first potential and the second potential are detected.

In another embodiment, once during a predetermined number of system clock cycles, the outputting of oscillator signals of the first oscillator and of the second oscillator is switched off, the difference between the counter readings of the first and of the second counter is forwarded to a comparator, the difference between the counter readings is compared with a predetermined threshold value in the comparator, and a voltage change signal is output for putting the circuit into a predetermined state if the difference is greater than the threshold value. By means of the predetermined number of system clock cycles, it is possible to predetermine for how long the first and the second oscillator run, or for how long their periods are counted by the first and the second counter. The first and the second oscillator are switched off in order that the first and the second counter supply stable counter readings. The difference between the counter readings is a measure of the voltage change between the first potential and the second potential. If this difference is greater than a predetermined threshold value, then the voltage changes are large enough that the circuit must be put into a predetermined state.

In another embodiment, after the comparison of the difference between the counter readings with the threshold value, the counter readings of the first counter and of the second counter are reset, and the outputting of oscillator signals of the first and of the second oscillator is switched on again. As a result of the counter readings being reset and the oscillator signals being switched on, it is possible to start a new cycle for monitoring a voltage change between the first potential and the second potential.

In another embodiment, a drive circuit is provided, which is configured to control the outputting of the oscillator signals and the resetting of the counter readings in a manner dependent on the system clock of the circuit. The drive circuit can comprise delay elements, such that settled oscillator signals are present at the counters and settled counter readings are present at the comparator before a difference is formed.

In another embodiment, the circuit arrangement comprises a second circuit arrangement, the second circuit arrangement detecting voltage changes if, in the first circuit arrangement, the outputting of oscillator signals of the first and of the second oscillator has been switched off or the counter readings of the first and of the second counter are in the reset state. If the oscillator signals have been switched off or the counters are in the reset state, which can also comprise the resetting itself, a voltage monitoring cannot tale place. The second circuit arrangement makes it possible also to ensure a voltage monitoring for these time periods, such that a monitoring for voltage changes is continuously present. Furthermore, the use of the second circuit arrangement results in a relaxing of the very strict temporal requirements for starting and stopping the oscillator outputs and for resetting the counter readings which arise on account of the high oscillator frequencies of approximately 500 to 1 GHz.

In another embodiment, the first counter outputs a first counter signal, which causes the second oscillator to output an oscillator signal until the first counter reading reaches a first count, and prevents the outputting of the oscillator signal of the second oscillator when the first count is exceeded by the first counter reading. The second oscillator thereby runs for a time predetermined by the first oscillator, namely for the counter readings $N1 \leq L1$. It is subsequently switched off, such that the counter reading of the second counter no longer changes. The first oscillator therefore serves as a voltage-change-independent time base that is used to determine frequency changes of the second oscillator on account of voltage changes.

In another embodiment, the first oscillator outputs an oscillator signal in uninterrupted manner, such that there is no need for any switch-on and switch-off logic for controlling the outputting of the first oscillator signal.

In another embodiment, the first oscillator outputs a second counter signal when the first counter reading reaches a second count, said second counter signal triggering the comparison of the counter reading of the second counter with a predetermined value in a comparator in the comparison circuit, the second count being greater than the first count. As a result of the different counts, there is a time interval within which the second counter can produce a stable counter reading.

In another embodiment, the first counter outputs a third counter signal when the first counter reading reaches a third count, said third counter signal forwarding the result of the comparison in the comparator as voltage change signal to the circuit, the third count being greater than the second count. A time interval within which the output signal of the comparator can settle arises as a result of the different counts.

In another embodiment, the third counter signal resets the counter readings of the first counter and of the second counter. In this way, a new cycle of the voltage monitoring can be started and the number of oscillations which are to be maximally counted by the counter can be reduced.

In another embodiment, the first count and the second count are chosen such that enough time is available for a stable counter reading of the second counter to be present at the comparator. For this purpose, the first count and the second count can differ by one or more in order that no non-settled counter reading is accepted into the comparator.

In another embodiment, the second count and the third count are chosen such that enough time is available for a stable voltage change signal to be present at the comparator output. The second count and the third count can differ by one or more if the comparator requires a relatively long time to generate a stable output signal. In this way it is possible to prevent the circuit from being erroneously put into a predetermined state by non-settled signals.

In another embodiment, the third count is the largest countable counter reading of the first counter. The counting range of the first counter is therefore fully utilized and the voltage monitoring is carried out with the highest possible accuracy.

Figure 1:
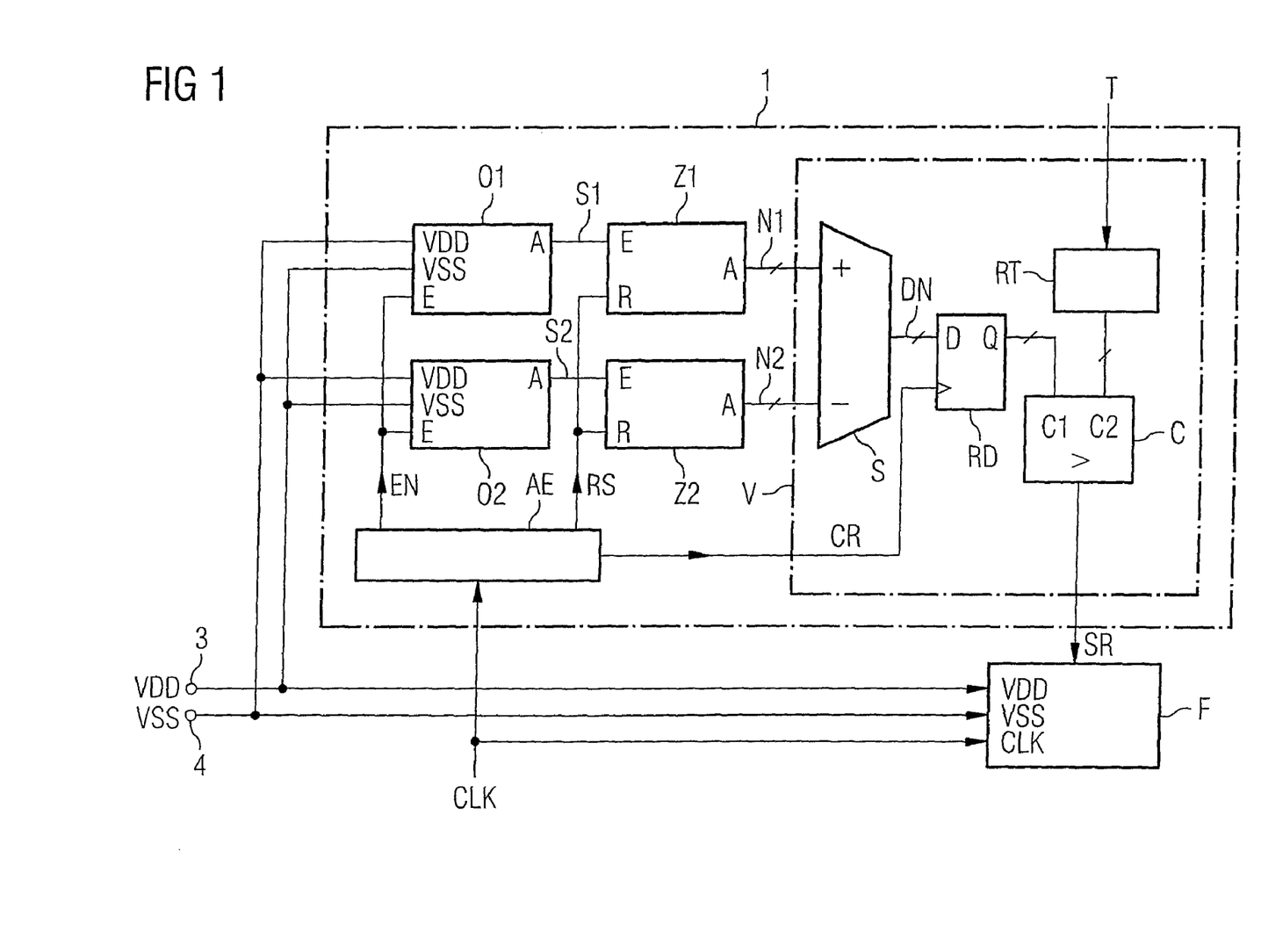
FIG. 1 shows a block diagram of a first exemplary embodiment of a circuit arrangement for detecting voltage changes.

FIG. 1 shows a block diagram of a first exemplary embodiment or a circuit arrangement 1 for detecting the voltage changes between a first potential VDD provided at first supply terminal 3 and a second potential VSS provided at supply terminal 4. If impermissible voltage changes are detected here then the circuit arrangement 1 supplies a voltage change signal SR to a circuit F, which puts the circuit F into a predetermined state. The circuit F can provide a security-critical application, for example, the function of which is to be protected against manipulations by impermissible voltage changes. It is operated with the system clock CLK and, in the event of a voltage change signal SR, moves into a start state, an initialization state or an inhibited state, such that secret data or algorithms cannot be spied out as a result of an erroneous function.

The circuit arrangement 1 has, for detecting impermissible voltage changes, a first oscillator O1 and a second oscillator O2, which are operated with the first potential VDD and the second potential VSS. The oscillators O1, O2 each have an input E for applying an enable signal, which controls the outputting at the respective output A of the respective oscillator signal S1 and S2. The frequency of the oscillator signal S1 of the first oscillator O1 has a lower voltage dependence with respect to voltage changes between the first potential VDD and the second potential VSS than the frequency of the oscillator signal S2 of the second oscillator O2. The first oscillator O1 can therefore be regarded as a reference and the second oscillator O2 as a sensor for voltage changes. The first and the second oscillator O1, O2 can be any desired oscillators, but the construction as ring oscillators is advantageous, said construction being described in more detail later.

For evaluating the frequencies of the oscillator signals S1 and S2, the circuit arrangement 1 comprises a first and a second evaluation circuit Z1 and Z2. The evaluation circuits Z1 and Z2 are realized as counters, but it is also possible to evaluate the frequency by means of other methods, such as a frequency-voltage converter, for example. The comparison circuit V would then have to be modified to the effect that it no longer compares counter readings but rather voltages with one another. Evaluation circuits Z1 and Z2 which can be realized purely digitally are expedient, however, for monolithic integration. The first and the second counter Z1 and Z2 are connected in each case via an input E to the associated oscillator signal S1 or S2 of the oscillators O1 and O2. At their respective outputs A, they output a first counter reading N1 and a second counter reading N2, respectively, which are in each case proportional to the frequency of the assigned oscillator signal S1 and S2, respectively. Via a reset input R, the counter readings N1 and N2 of the counters Z1 and Z2 can be reset by a reset signal RS to a start value, which can be zero, for example, in the case of an upward-counting counter. Upward-counting counters are used hereinafter, though the description with corresponding changes is also applicable to a downward-counting counter.

The circuit arrangement 1 furthermore has a comparison circuit V, in which a value based on the evaluated frequencies of the first oscillator O1 and of the second oscillator O2 is compared with a predetermined threshold value. If the value is greater than the threshold value, a voltage change signal SR is output which indicates an impermissible voltage change between the first potential VDD and the second potential VSS and which is used by the circuit F in order to be put into a predetermined state. The comparison circuit V is constructed for example with a subtractor S, a difference register RD, a threshold value register RT and a comparator C. The subtractor S supplies at its output the difference DN between the counter reading N1 of the first counter Z1 and the counter reading N2 of the second counter Z2. Upon a rising edge of the clock signal CR, the difference DN is accepted into the difference register RD and is present at the output Q thereof. A threshold value T for the counter difference DN is stored in a threshold value register RT. The difference DN and the threshold value T are present at the first input C1 and the second input C2, respectively, of the comparator C. The comparator C compares the quantities present at its inputs C1 and C2 and outputs a voltage change signal SR with a low level if the difference DN between the counter readings is less than the threshold value T, and outputs a voltage change signal with a high level if the difference DN is greater than the threshold value T. It goes without saying that the levels of the voltage change signal SR can also be interchanged as long as the desired predetermined state is thereby achieved in the circuit F.

The circuit arrangement 1 furthermore has a drive circuit AE, which, from the system clock CLK, outputs enable signals EN for the oscillators O1, O2, the reset signal RS for the counters Z1, Z2 and a clock signal CR for driving the difference register RD and defines them in the correct temporal order. In this way, besides the correct function, the propagation times through the oscillators O1 and O2, the counters Z1 and Z2 and the subtractor S can also additionally be taken into account. The outputting of the oscillator signals S1, S2 is controlled by the enable signal EN. If the enable signal EN has a low level, then no oscillation arises in the oscillator signals S1, S2. The clock signal CR is output only after the oscillator signals S1, S2 and the counter readings N1, N2 of the counters and also the difference between the counter readings DN have settled, in order to avoid the processing of incorrect levels and values. The reset signal RS, which sets the counter readings to the values N1=0 and N2=0, can be effected with the outputting of the clock signal CR since the counter difference DN has already been stored in the difference register RD. The drive circuit AE produces the signals EN, RS, CR once during one or more cycles of the system clock CLK.

Figure 2:
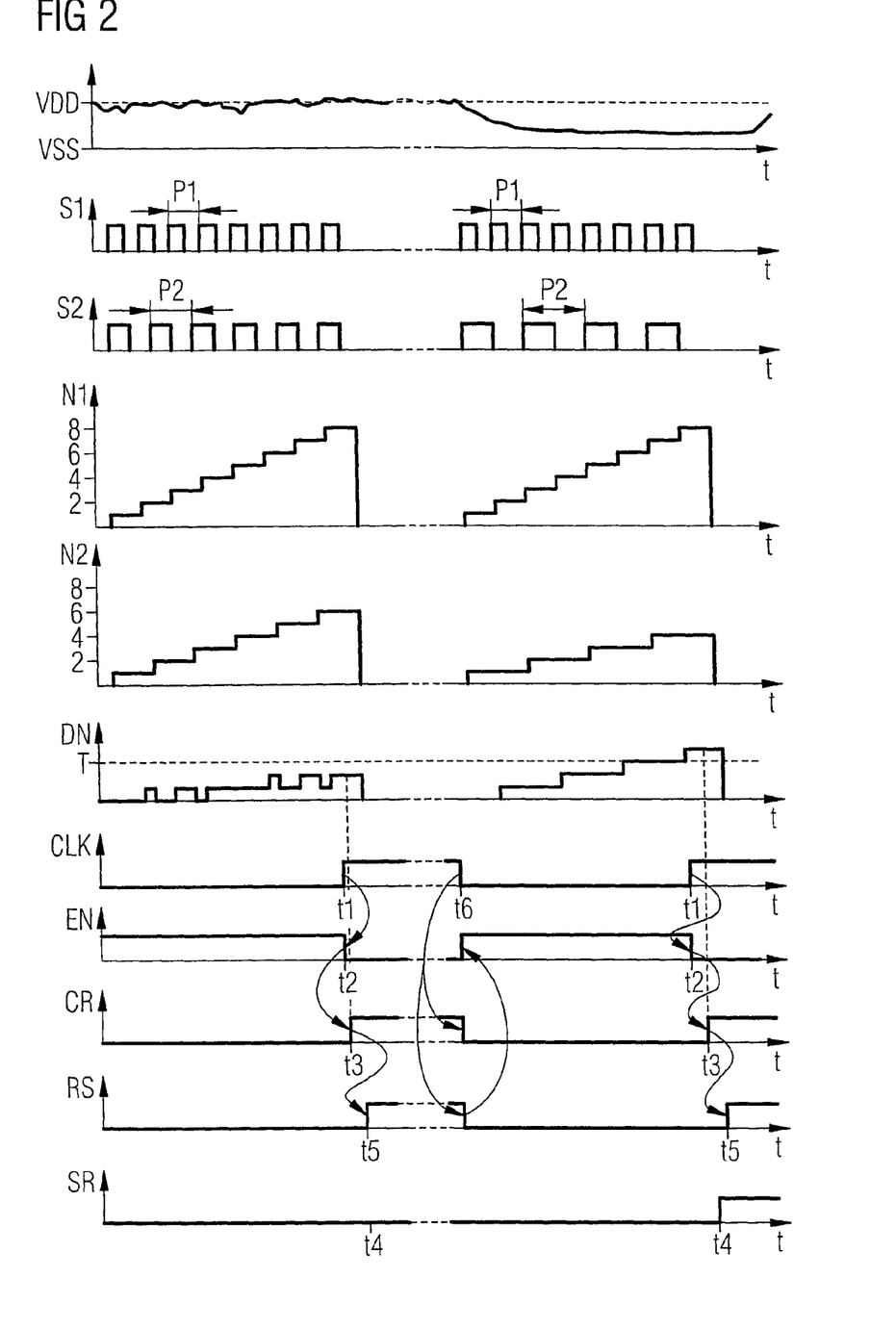
FIG. 2 shows exemplary signal curves during operation of the first exemplary embodiment.

FIG. 2 shows exemplary signal curves during operation of the first exemplary embodiment from FIG. 1. The signal curves in the figure are divided into a left-hand half and a right-hand half. In the left-hand half voltage changes between the first potential VDD and the second potential VSS are within a permissible range, while the voltage changes in the right-hand half are impermissible since they are too large or last too long, and a voltage change signal SR is output which puts the circuit F into a predetermined state. The voltage changes between the first potential VDD and the second potential VSS are shown in the first signal curve, where VSS serves as a reference point, while VDD indicates the voltage changes. The first potential VDD and the second potential VSS are used for operating the first oscillator O1 and the second oscillator O2, which produce the respective oscillator signals S1 and S2, which are shown in the second and third signal curves. The frequency of the oscillator signals S1 and S2 lies for example between 500 MHz and 1 GHz, such that the period P1 of the oscillator signal S1 is between 1 and 2 ns. The circuit arrangement 1 is thereby able to detect very short-term voltage changes in the region of 10 ns, for example.

The oscillator signal S1 of the first oscillator has a relatively constant period P1 that is largely independent of voltage changes. The relative voltage independence can be attributed to the voltage stabilization circuit SC, which will be described later. The periods P1 on the left-hand and right-hand sides of the figure are therefore approximately identical. The situation is different for the oscillator signal S2 of the second oscillator O2. The latter is not provided with a voltage stabilization circuit, such that a decrease in the voltage between the first potential VDD and the second potential VSS directly affects the frequency and period duration P2 thereof. On the left-hand side, the small decrease in the voltage leads to a period P2 which is somewhat greater than the period P1 of the first oscillator signal S1. On the right-hand side, by contrast, a larger voltage change is present, such that the period P2 is considerably increased relative to the period P1.

The next two signal curves respectively illustrate the counter readings N1 and N2 of the first counter Z1 and the second counter Z2, with which the frequencies of the first oscillator O1 and of the second oscillator O2 are evaluated. The counter readings N1 and N2 indicate for example the frequency or how many periods of the oscillator signals S1 and S2, respectively, have been counted. The counter reading N1 of the first counter Z1 has approximately identical temporal curves on the left-hand side and the right-hand side of the figure, which can be attributed to the relative voltage insensitivity of the frequency of the first oscillator signal S1. By contrast, the curve of the counter reading N2 of the second counter Z2 on the left-hand side differs significantly from that on the right-hand side. N2=6 pulses are counted on the left-hand side, while only N2=4 are counted on the right-hand side in the same time period. The lower voltage on the left-hand side of the figure leads to a lower frequency of the second oscillator O2 and to a lower counter reading N2 of the second counter Z2.

The signal curve lying underneath shows the difference DN between the first counter reading N1 and the second counter reading N2. A predetermined threshold value T is also shown in addition, said threshold value being used to determine the difference DN starting from which a voltage change signal SR is output for putting the circuit F into a preset state. A maximum counter difference DN which is less than the threshold value T is shown on the left-hand side of the figure, while the difference DN is greater than the threshold value T on the right-hand side. Upon evaluation of the differences DN at the instants t4, a corresponding voltage change signal SR is output depending on the comparison, see the bottommost signal curve. The threshold value T can be chosen such that it is adapted to the length and the intensity of the voltage disturbance which would lead to an erroneous function of the circuit F.

The signal curves EN, CR and RS likewise shown are produced from the system clock CLK by the drive circuit AE. At the instant t1 the edge of the system clock CLK rises, and at the instant t2 no enable signals EN are present at the oscillators O1 and O2, whereby no new oscillations arise in the oscillator signals S1 and S2. In this case, the instant t1 can coincide with the instant t2. The instant t3, which occurs after the instant t2, is chosen such that the oscillator signals S1 and S2 and the counter readings N1 and N2 and also the difference DN between the counter readings are stable. By means of the signal CR, the difference DN between the counter readings is accepted into the difference register RD and stored there. The difference DN between the counter readings is forwarded to the comparator C, where is it compared with the threshold value T from the register RT. At the instant t4, a comparison result is present at the output of the comparator C and the voltage change signal SR is output. Since the difference DN is below the threshold value T on the left-hand side of the figure, no voltage change signal SR is output, such that the circuit F is not put into a predetermined state. At the instant t5, the first counter reading N1 and the second counter reading N2 are reset to the value zero by the reset signal RS. In this case, the instant t5 can be identical to the instant t4 since the difference DN between the counter readings has already been stored in the difference register RD and would change only upon the next rise in the signal CR. A resetting of the counter readings N1 and N2 is always necessary before one of the counters reaches its largest countable counter reading and thereupon starts to count at zero again, since otherwise a jump arises when determining the difference DN between the counter readings N1 and N2.

On the right-hand side of the figure, the voltage change leads to the threshold value T being exceeded by the counter differences DN. In this case, the curve at the instants t1 to t5 essentially corresponds to that on the left-hand side, a high level for the voltage change signal SR being output at the instant t4. This signal SR indicates that impermissibly large voltage changes were present, such that the circuit F can be moved into a predefined state for protection against manipulation.

After the resetting of the counter readings N1 and N2, the circuit arrangement 1 can again be used anew for detecting voltage changes. At the instant t6, this occurs for example as a result of a falling edge of the system clock CLK. With the aid of this edge, the clock signal CR for the difference register RD and the reset signals RS for the counter readings N1 and N2 are set to a low level. At the same time or subsequently, a high-level enable signal EN is again applied to the first and second oscillators O1 and O2. A new monitoring cycle can also be triggered by delay elements in the drive circuit AE instead of the falling edge of the clock signal CLK. It is also possible to use pulses for the clock signal CR of the difference register RD and for the reset signal RS, such that after the pulse duration these are automatically put into the desired states for a new monitoring cycle. Furthermore, the drive circuit AE, by means of a clock divider for the system clock CLK, can output the signals EN, RS and CR in each case for a multiple period of the system clock CLK.

Figure 3:
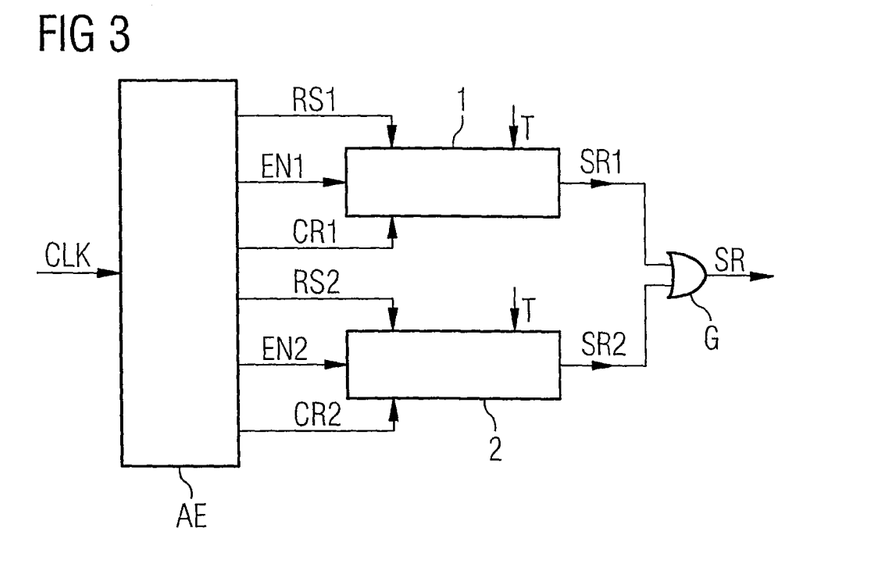
FIG. 3 shows a block diagram of a second exemplary embodiment with two circuit arrangements for detecting voltage changes.

FIG. 3 shows a block diagram of a second exemplary embodiment with two circuit arrangements 1 and 2 for detecting voltage changes. As specified in the description in FIG. 2, no monitoring of the voltage between the first potential VDD and the second potential VSS takes place in the time t5 to t6 since here the oscillators O1 and O2 do not output any oscillator signals S1 and S2 and the counters Z1 and Z2 are in the reset state. If the instant t6 is predetermined by the falling system clock edge CLK, then this means that in the case of a system clock CLK with a duty ratio of 0.5, during half a system clock period, no voltage monitoring takes place and an attack would not be identified. FIG. 3 shows a solution to this problem by provision of a second circuit arrangement 2, which monitors the voltage for changes during the monitoring gap. The second circuit arrangement 2 is identical to the circuit arrangement 1 shown in FIG. 1. Instead of two separate drive circuits AE for the circuit arrangements 1 and 2, in FIG. 3 a combined drive circuit AE coordinates the drive signals EN1, EN2, CR1, CR2, RS1 and RS2 for the first and the second circuit arrangement 1 and 2, such that a voltage monitoring takes place continuously. The first circuit arrangement 1 and the second circuit arrangement 2 supply the voltage change signals SR1 and SR2, respectively, which are logically combined via an OR gate G to form a voltage change signal SR. Should one or both of the circuit arrangements 1 or 2 detect a voltage change, then this is passed on to the circuit F by way of the voltage change signal SR.

Figure 4:
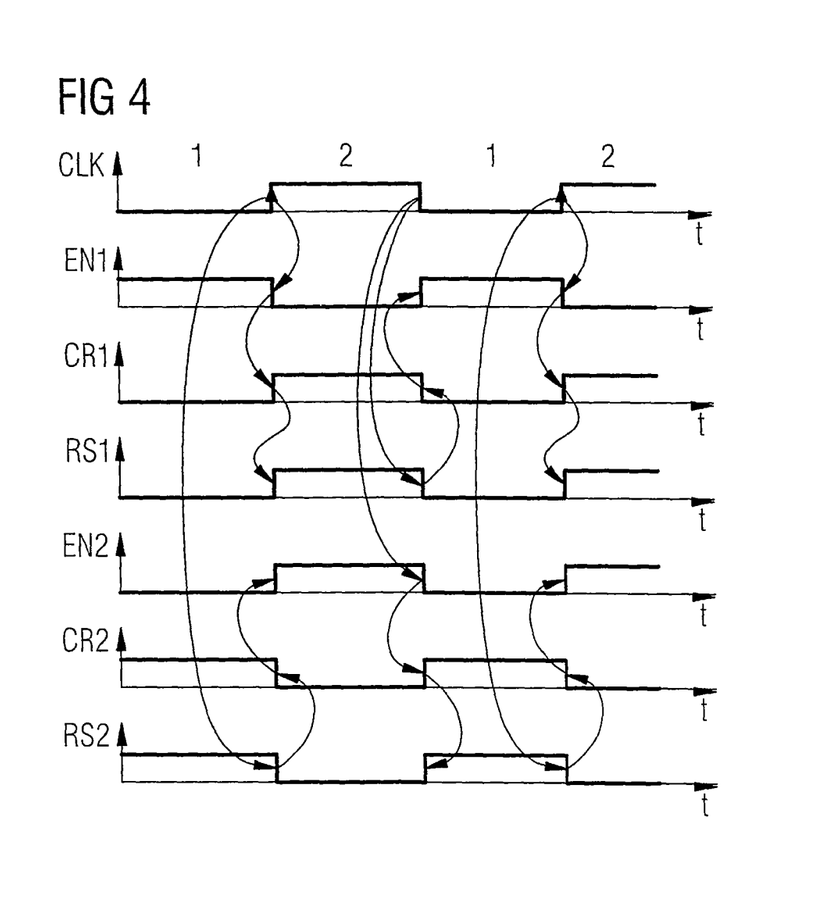
FIG. 4 shows exemplary signal curves during operation of the second exemplary embodiment.

FIG. 4 shows exemplary signal curves during operation of the second exemplary embodiment from FIG. 3. The first circuit arrangement 1 undertakes the monitoring at a low level of the system clock CLK, and the second circuit arrangement 2 at a high level. As a result of the rising system clock edge CLK, the oscillators O1 and O2 in the first circuit arrangement 1 are switched off by the enable signal EN1, a comparison with the threshold value T is started by the signal CR1, and the first and the second counter reading N1 and N2 are reset by the signal RS1. With the rising system clock edge CLK, the reset signal RS2 of the counters Z1 and Z2 of the second circuit arrangement 2 is also cancelled, the signal CR2 for the acceptance of the counter reading difference DN into the comparator C is reset and the first and second oscillators O1 and O2 of the second circuit arrangement 2 are started by means of the signal EN2. With the falling signal clock edge CLK, in the circuit arrangement 2 the oscillators O1 and O2 are stopped by means of the signal EN2, a signal CR2 for accepting the difference DN between the counter readings is output and the counter readings of the counters are subsequently reset by means of the signal RS2. Afterward or at the same instant, in the first circuit arrangement 1 the reset signal RS1 is cancelled, the clock signal CR1 for the acceptance of the counter reading differences is reset and the oscillators O1 and O2 are started again by the signal EN1. In this way, it is possible to continuously monitor the voltage between the first potential VDD and the second potential VSS for voltage changes. The signals EN1, EN2, CR1, CR2, RS1 and RS2 can in this case also be generated in the manner described in FIG. 2.

Figure 5:
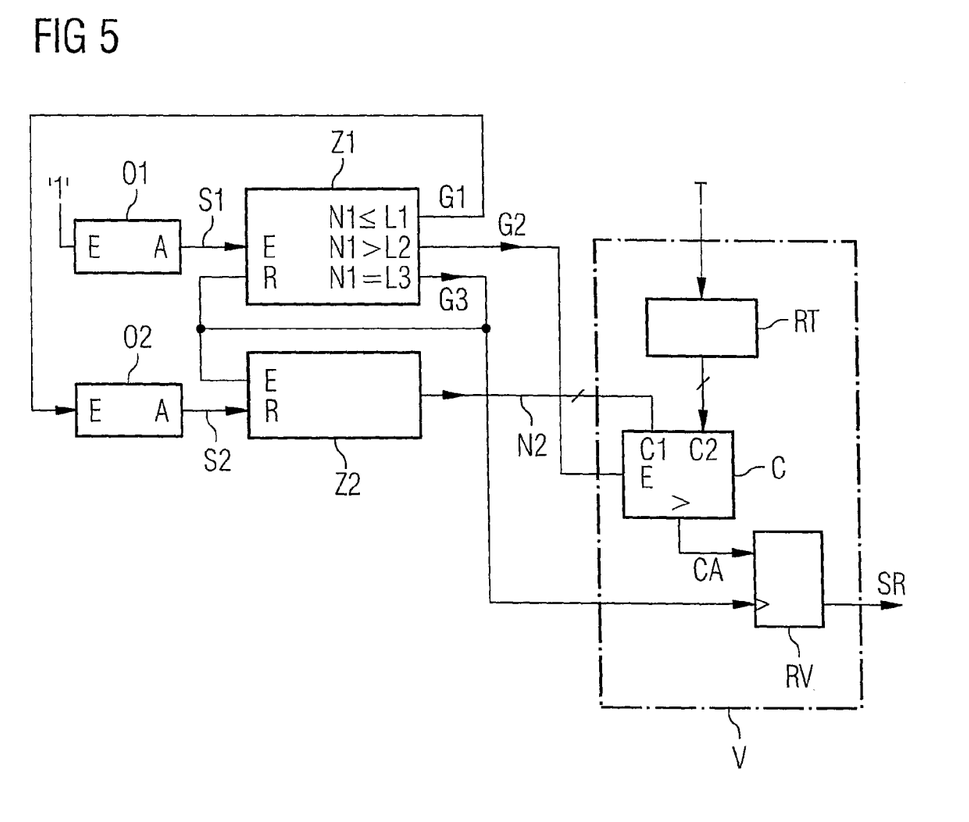
FIG. 5 shows a block diagram of a third exemplary embodiment of a circuit arrangement for detecting voltage changes.

FIG. 5 shows a block diagram of a third exemplary embodiment of a circuit arrangement for detecting voltage changes. The first oscillator O1 and the second oscillator O2 are identical to those in FIG. 1 and have the voltage dependencies of their frequencies as described there. By comparison with FIG. 1, the circuit F and the first potential VDD and the second potential VSS are not shown. The first oscillator O1 continuously produces an oscillator signal S1 at its output A since a high level is present at its enable input E. The oscillator signal S1 is fed to the counter Z1, the latter not outputting its counter reading N1 but rather first, second and third counter signals G1, G2 and G3. The counter signals G1, G2 and G3 are dependent on the counter reading N1 and the respective first, second and third counts L1, L2 and L3. The second counter Z2 corresponds to the counter Z2 from FIG. 1. It receives at its input E the oscillator signal S2 of the second oscillator O2 and outputs a second counter reading N2 for evaluating the frequency of the second oscillator signal S2. The second oscillator O2 has the first counter signal G1 present at its enable input E. If the first counter reading N1 is less than or equal to the first count L1 (N1<=L1), then a high level is present at the enable input E and the second oscillator O2 outputs an oscillator signal S2. If the first counter reading N1 exceeds the first count L1, then the first counter signal G1 has a low level and the outputting of the oscillator signal S2 is stopped. Upon further counting of the counter Z1, its counter reading N1 reaches a second count L2, upon the exceeding of which (N1>L2) the level of a second counter signal G2 changes in a high level. The second counter signal G2 is fed to an enable input E of a comparator C and starts the comparison of the quantities present at its first input C1 and second input C2. The second counter reading N2 is present at the first input C1 of the comparator C, while the threshold value T is present at the second input C2 of the comparator C, said threshold value being stored in a threshold value register RT. Since the first oscillator O1 runs continuously, the first counter reading N1 subsequently reaches a third count L3 (N1=L3), whereby a third counter signal G3 changes to a high level. The third counter signal G3 starts the acceptance of the result of the comparison between the threshold value T and the counter reading N2 at the comparator output CA into a voltage change register RV, which outputs a corresponding voltage change signal SR by means of which, as described above, a circuit F can be put into a predetermined state. At the same time, by means of the third counter signal G3, the first and the second counter Z1 and Z2 are reset, that is to say that the counter readings have the value N1=N2=0.

The first, the second and the third counts L1, L2 and L3 are chosen such that there is enough time for stable signals to be present at the first input C1 and at the output CA of the comparator C. It is noticeable in comparison with FIG. 1 that the circuit shown in FIG. 5 operates without a system clock CLK, nor does it have a drive circuit AE. Stability problems that could occur as a result of differences in the propagation times of the oscillator-counter arrangement can thereby be avoided. Furthermore, the independence of the system clock CLK enables an evaluation frequency of voltage changes which is higher than that of the system clock CLK and permits a quasi-continuous monitoring of the voltage between the first potential VDD and the second potential VSS without having to duplicate the circuit arrangement 1 as in FIG. 3. A further advantage is that now there is no need for a subtractor S that has to process the differences DN in the counter readings N1 and N2 at the frequency of the first oscillator O1.

Figure 6:
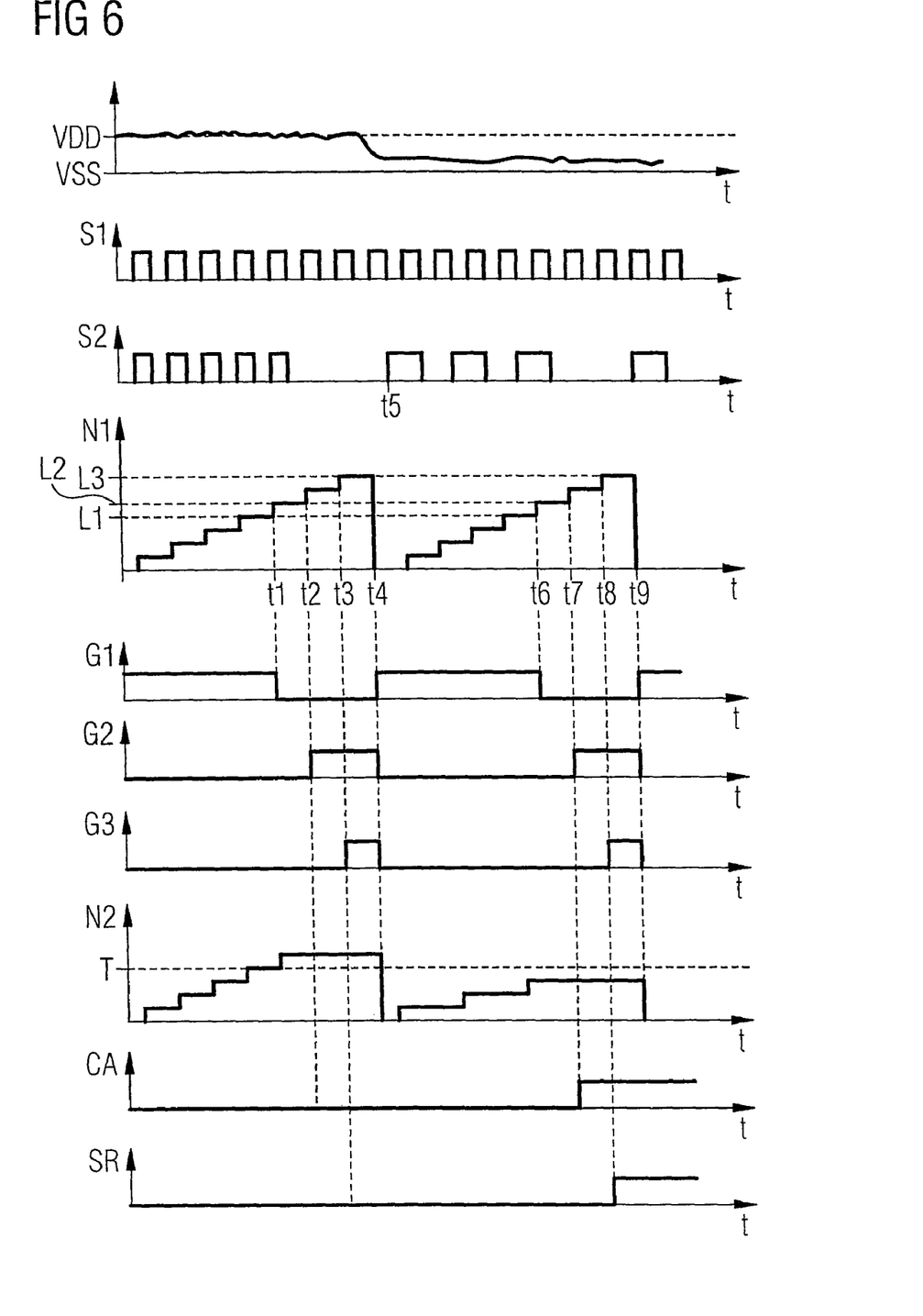
FIG. 6 shows exemplary signal curves during operation of the third exemplary embodiment.

FIG. 6 shows exemplary signal curves during operation of the third exemplary embodiment shown in FIG. 5. The figure is set up similarly to FIG. 2, such that signals in the case of permissible voltage changes are shown on the left-hand side and signals in the case of impermissible voltage changes are shown on the right-hand side. The first oscillator produces an oscillator signal S1 which in terms of its frequency, in comparison with the frequency of the second oscillator signal S2, is less dependent on a voltage change between the first potential VDD and the second potential VSS. The pulses of the oscillator signal S1 are counted in the counter Z1, the levels of a first, a second and a third counter signal G1, G2 and G3 changing in the event of a first, a second and a third count L1, L2 and L3.

The first counter signal G1 has a high level if the counter reading N1 of the first counter Z1 is less than or equal to the first count L1 (N1<=L1), and has a low level if the counter reading N1 is greater than the first count L1 (N1>L1). As long as the first counter signal G1 has a high level, the second oscillator O2 produces an oscillator output signal S2, that is to say until the instant t1 in FIG. 6. The pulses of the oscillator signal S2 are counted in the second counter Z2, such that the counter reading N2 thereof increases with time t. After the second oscillator O2 has been switched off at the instant t1, no new oscillator signals S2 occur, such that the counter reading N2 is constant thereafter.

The second counter signal G2 has a high level if the counter reading N1 of the first counter is greater than the second count L2 (N1>L2) and otherwise has a low level. Upon a rising edge of the second counter signal G2, the values at the first and second inputs C1 and C2 of the comparator C2 are evaluated and the result is forwarded to the output CA of said comparator. The comparator output CA has a high level if the value at the second input C2 is greater than the value at the first input C1. The evaluation takes place at the instant t2 in FIG. 6. On the left-hand side, N2, which is present at the first input C1, is greater than the threshold value T present at the second input C2. The comparator output CA therefore has a low level. The second count L2 is chosen such that the counter reading N2 of the second counter Z2 can supply a stable input value for the comparator C after the switch-off by the first counter signal G1. In the example here, the first and the second count L1 and L2 directly succeed one another. If there is insufficient time available for the settling of the counter reading N2, it is possible, by means of a greater separation between the first and the second counts L1 and L2, for a plurality of clock cycles of the oscillator signal S1 of the first oscillator O1 to be counted until stable signals are present.

The third counter signal G3 has a high level if the counter reading N1 of the first counter is equal to a third count L3 (N1=L3), otherwise the third counter signal G3 has a low level. At the instant t3, the counter reading N1 reaches the third count L3, whereby a rising clock edge of the third counter signal G3 arises. With the rising clock edge, the signal at the comparator output CA is accepted into a voltage change register RV and output as voltage change signal SR to a circuit F. The voltage changes between the first potential VDD and the second potential VSS are small or short enough on the left-hand side such that the second oscillator O2 output a frequency that was high enough for the counter reading N2 of the second counter Z2 to be greater than the threshold value T at an instant t2. The value at the comparator output CA has a low level, such that the voltage change signal SR also has a low level. Therefore, the circuit F is not put into a predetermined state. In the example shown, L3>L2+1 holds true. If necessary, a larger separation can be chosen between these two counts L2 and L3, such that more time for the settling of signals is possible. The third count L3 is typically chosen as the largest value that can be counted by the counter Z1, for example L3=63. The first count can be chosen to be L1=60 and the second count can be chosen to be L2=61.

The outputting of the third counter signal G3 furthermore has the effect that the counter readings N1 and N2 of the first and of the second counter Z1 and Z2 are reset. At the instant t4, therefore, N1=N2=0 holds true. The conditions which have to be met for the outputting of the first, the second and the third counter signal G1, G2 and G3 for a level change also change with the resetting of the counter readings N1 and N2. At the instant t4, the first counter signal G1 again outputs an enable signal for the second oscillator O2, such that the latter produces an oscillator signal S2 again at the instant t5. The second and third counter signals G2 and G3 are reset to a low level, such that their next rising clock edges again enable values to be output from the comparator C and the voltage change register RV. The sequence described is continuously repeated. The counter signals G1, G2 and G3 can be generated for example by simple gates in the counter Z1, these having individual digits of the counter reading N1 as inputs. If, by way of example, the third count L3 is equal to the highest countable value of the counter, then the counter reading N1 consists of a sequence of ones that are fed to an AND gate. The output of the AND gate signals the third count L3.

On the right-hand side of the signal curves from FIG. 6, the voltage between the first potential VDD and the second potential VSS changes in an impermissible manner. As a consequence of this, the second oscillator O2 produces an oscillator signal S2 with a slower frequency, whereby the counter reading N2 of the second counter Z2 increases less rapidly. The order of the temporal sequence corresponds to that on the left-hand side. The oscillator signal S2 is switched off at the instant t6. With the rising edges of the second counter signal G2, the comparator C is evaluated at the instant t7. The counter reading N2 lies below the threshold value T on account of the lower frequency, such that the comparator C outputs a high level at its comparator output CA. With the rising clock edge of the third counter signal G3 at the instant t8, the signal at the comparator output CA is transferred into the voltage change register RV and forwarded as voltage change signal SR to the output of said register. The voltage change signal SR then has a high level, which indicates that the voltage changes were impermissible and which puts the circuit F into a predetermined state, which is assumed for example upon the next change in the level of the system clock CLK.

With the outputting of the voltage change signal SR, the circuit arrangement 1 and 2 for detecting voltage changes can continue to run or else assume a different state and be switched off, for example. The curves of the counter readings N1 and N2 shown in FIG. 2 and FIG. 6 can also have other maximum possible counter readings; those shown serve merely for elucidating the exemplary embodiments.

Figure 7:
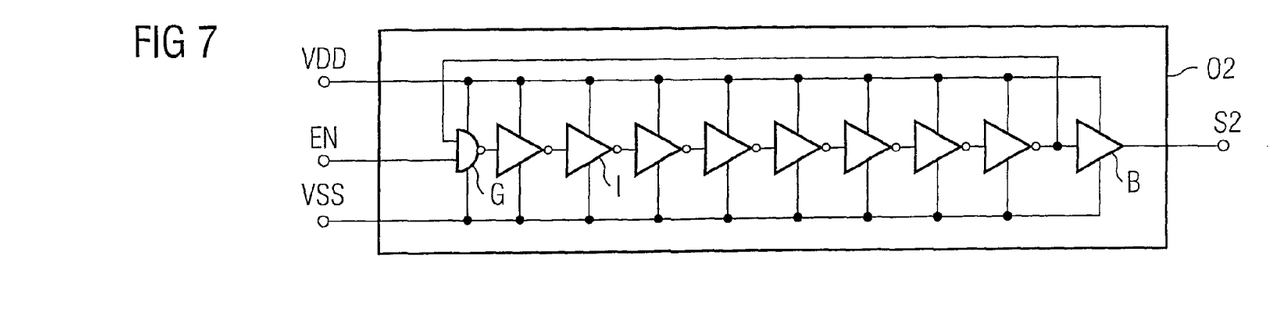
FIG. 7 shows a block diagram of an exemplary embodiment of the second oscillator.

FIG. 7 shows a block diagram of an exemplary embodiment of a second oscillator O2. The oscillator O2 is constructed as a ring oscillator and has an enable input EN, inputs for applying a first potential VDD and a second potential VSS, but also an output for outputting an oscillator signal S2. It consists of a series circuit of one NAND gate G, eight inverters I and one buffer B. An oscillation occurs as a result of the feedback of an odd number of inverting gates G and I. If a high level is present at the enable input EN, then the NAND gate G acts as an inverter. If, instead, a low level is present at the enable input EN, the NAND gate G always has a high level at the output, whereby oscillations are no longer possible. In the case of a constant supply voltage, the period of the oscillation is dependent on the propagation time through the inverting gates G and I and oscillators having relatively high frequencies of 500 MHz to 1 GHz can be constructed in a simple manner. The frequency of the oscillator signal S2 can thus be established by the number of inverting gates G and I and can be adapted to the remaining elements of the circuit arrangement 1 or to the requirements made of the speed of identification of voltage changes. In the event of a higher voltage between the first potential VDD and the second potential VSS, the gates G and I switch more rapidly, such that their propagation time is shortened and the frequency of the oscillator is increased. Conversely, a lowering of the voltage leads to a lower frequency.

Figure 8:
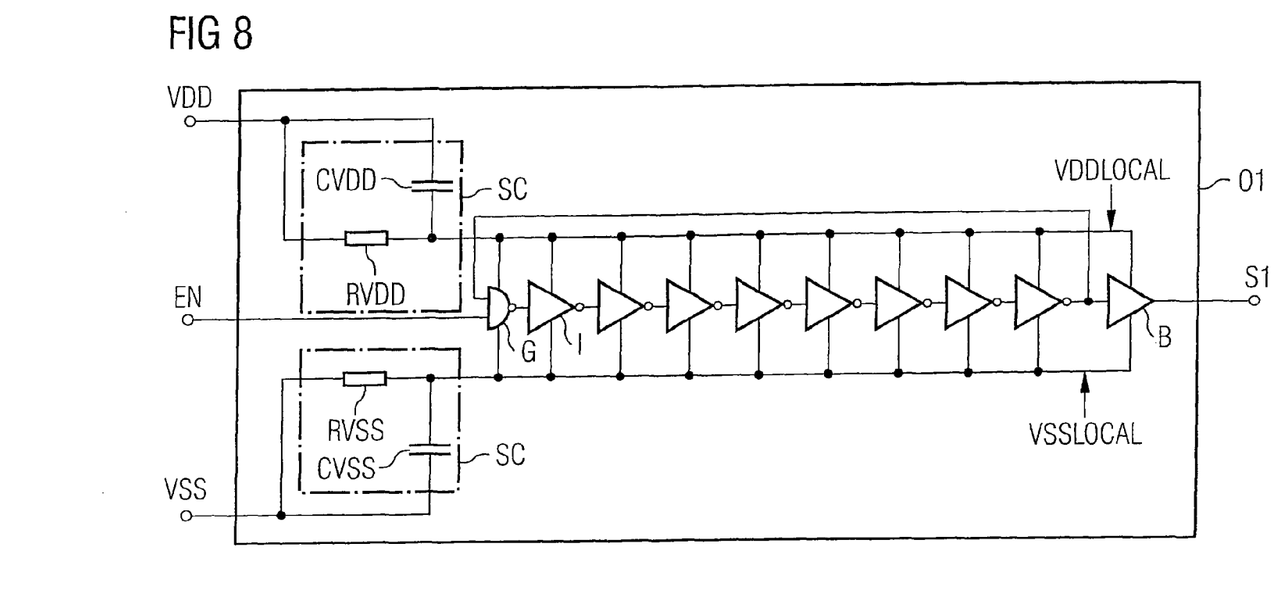
FIG. 8 shows a block diagram of an exemplary embodiment of the first oscillator.

FIG. 8 shows a block diagram of an exemplary embodiment of a first oscillator O1 having inputs for applying a supply voltage VDD, VSS and an enable signal EN, and also having an output for an oscillator signal S1. The construction of the first oscillator O1 is identical to the oscillator O2 shown in FIG. 7, two voltage stabilization circuits SC additionally being incorporated. The voltage stabilization circuits SC are connected to the first potential VDD and the second potential VSS, respectively, and the ring oscillator and serve for stabilizing the local supply potentials VDDLOCAL and VSSLOCAL. Consequently, voltage changes between the first and second potentials VDD and VSS are not passed on to the local supply potentials VDDLOCAL and VSSLOCAL, or are passed on only in a reduced manner. The voltage dependence of the frequency of the first oscillator O1 on voltage changes between the first potential VDD and the second potential VSS is therefore smaller than the voltage dependence of the frequency of the second oscillator O2.

The voltage stabilization circuits SC have stabilization capacitors CVDD and CVSS connected in parallel with the stabilization resistors RVDD and RVSS. It goes without saying that other voltage stabilization circuits SC are also possible. By virtue of the lower voltage sensitivity of the frequency of the second oscillator O2 to in particular short-term voltage changes, this oscillator can be used as a reference oscillator, while the frequency of the first oscillator O1 is suitable as a sensor for detecting voltage changes on account of the higher voltage sensitivity.

The oscillators O1 and O2 can also be constructed with other means; what is advantageous in the case of the realization as a ring oscillator, however, is that these have a simple and compact construction which can easily be monolithically integrated.

Figure 9:
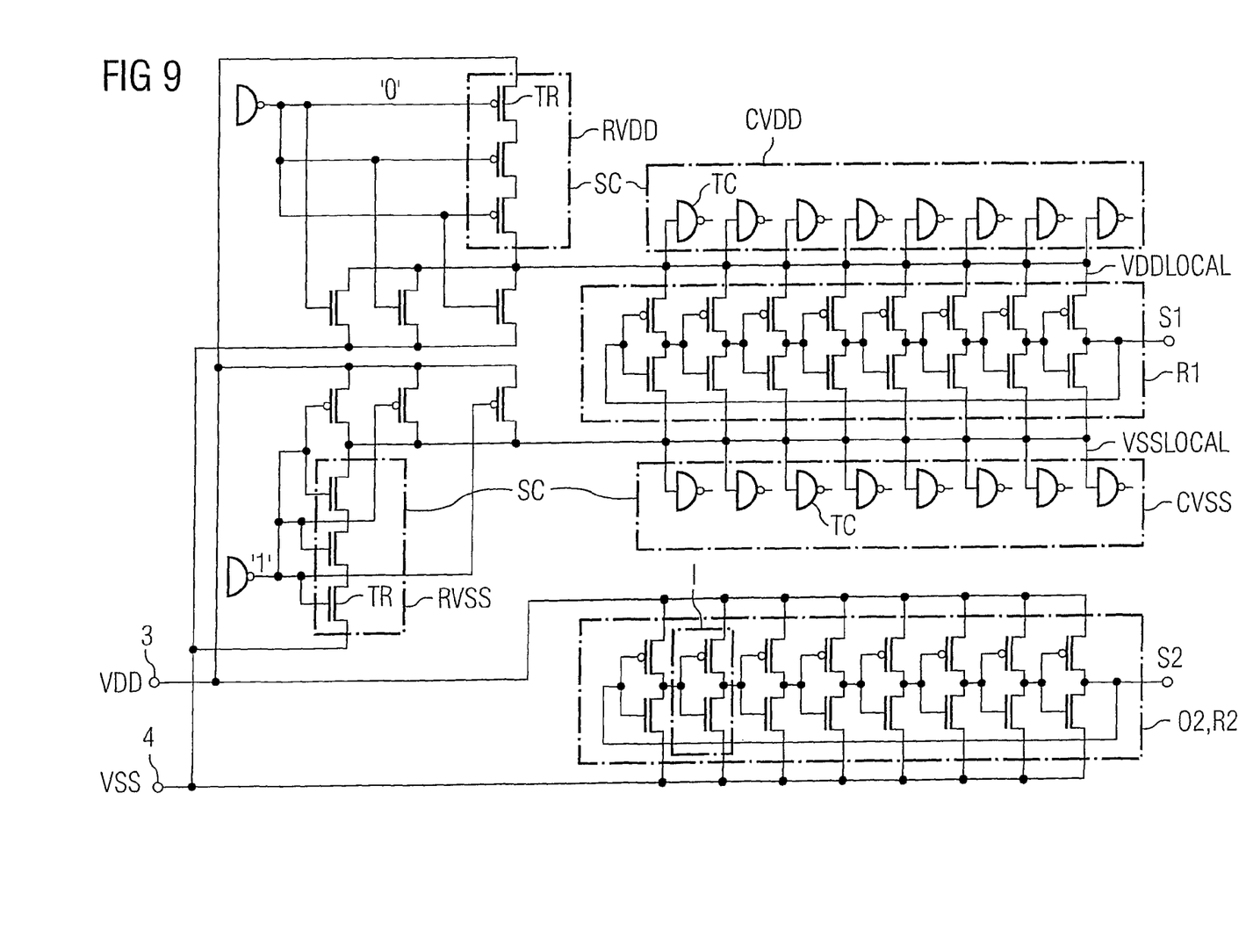
FIG. 9 shows a block diagram with an exemplary embodiment of the first oscillator with voltage stabilization circuits and an exemplary embodiment of the second oscillator.

FIG. 9 shows a block diagram with an exemplary embodiment of the first oscillator O1 with voltage stabilization circuits SC and an exemplary embodiment of the second oscillator O2 The circuits are constructed using CMOS technology.

An exemplary embodiment of the second oscillator O2 shown in FIG. 7 is shown in the lower half of FIG. 9. The NAND gate G for the enable signal EN and the buffer B are not shown, such that only the ring oscillator R2 is visible. The inverters I are in each case realized by a series circuit comprising a PMOS transistor and an NMOS transistor between the first potential VDD and the second potential VSS. Depending on the common gate signal of the transistors, the output of the inverter is connected either to the first potential VDD or to the second potential VSS.

An exemplary embodiment of the first oscillator O1 shown in FIG. 8 is shown in the upper half of FIG. 9. The ring oscillator R1 produces the oscillator signal S1 and is connected to the local potentials VDDLOCAL and VSSLOCAL. It is constructed like the second oscillator O2 and additionally has voltage stabilization circuits SC having the elements CVDD, RVDD and CVSS, RVSS, as shown in FIG. 8. The stabilization capacitors CVDD and CVSS are realized as gate capacitances of transistors TC. In this case, the transistors TC can be connected up like an inverter I of the ring oscillator R1, the capacitance being composed of the gate capacitance of the PMOS and NMOS transistors. In this case, the size of the gate capacitance is determined by the size of the transistor TC. In order to achieve the desired capacitance CVDD, a plurality of transistors TC can be connected in parallel. The stabilization capacitor CVSS is realized analogously.

The stabilization resistor RVDD is realized using a NOR gate having three inputs using CMOS technology, in which all three inputs have a low signal present at them. The first potential VDD is connected to the local potential VDDLOCAL via the series circuit comprising three turned-on PMOS transistors TR. Three NMOS transistors connected in parallel are connected to VDDLOCAL, said NMOS transistors also being connected to the second potential VSS. As a result of the low signal, these transistors are not turned on, such that no connection to the second potential VSS arises. The stabilization resistor RVSS is realized as a NAND gate having three inputs, which are at a high level, using CMOS technology. Three PMOS transistors connected in parallel are connected to the first potential VDD and the first local supply potential VSSLOCAL. The three inputs of the NAND gate are at a high level, whereby the PMOS transistors are not turned on, such that no connection to VDD arises. The second local supply line VSSLOCAL is connected to the second supply potential VSS via a series circuit comprising three NMOS transistors TR. The resistances RVDD and RVSS can be established as desired by means of the number of transistors or the number of inputs of the NAND and NOR components. Higher resistances can also be obtained by means of smaller transistors. What is advantageous in the case of the above-described realization of the stabilization capacitors CVDD and CVSS and the stabilization resistors RVDD and RVSS is that they can be monolithically integrated and no external components are required for the resistances or capacitances.

Figure 10:
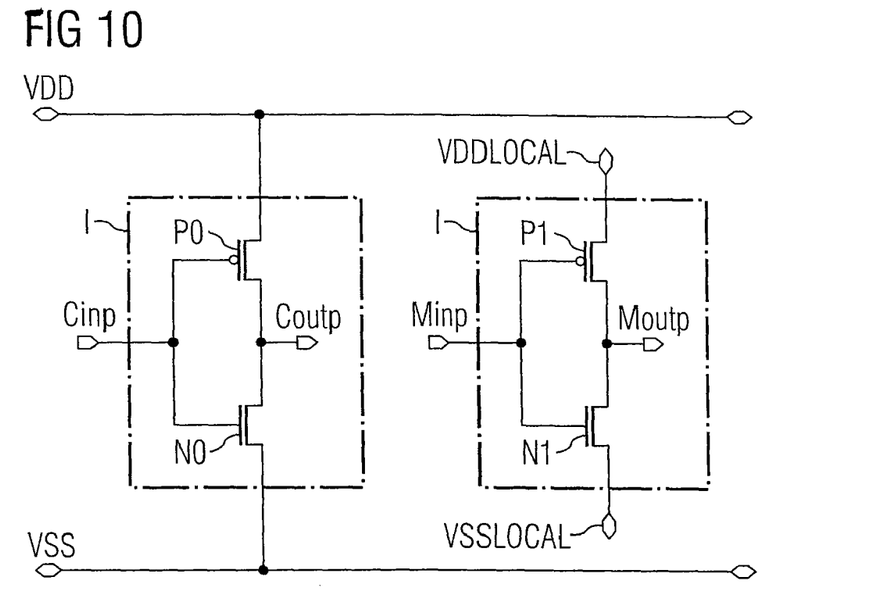
FIG. 10 shows a block diagram with exemplary embodiments for inverting gates of the first oscillator and of the second oscillator.

FIG. 10 shows a block diagram with exemplary embodiments of inverting gates I of the first oscillator O1 and of the second oscillator O2. The inverter I for the second oscillator O2 consists of the PMOS transistor P0 and the NMOS transistor N0. It is connected to the first potential VDD and the second potential VSS. The inverter I for the first oscillator O1 consists of the PMOS transistor P1 and the NMOS transistor N1. It is connected to the first and the second local supply potential VDDLOCAL and VSSLOCAL. Together the two inverters form a modified delay gate in which all the inverters I are created in spatial proximity by means of the same production process. Changes to the propagation time and the frequency of the oscillators on account of process fluctuations can be reduced to a minimum in this way.

Figure 11:
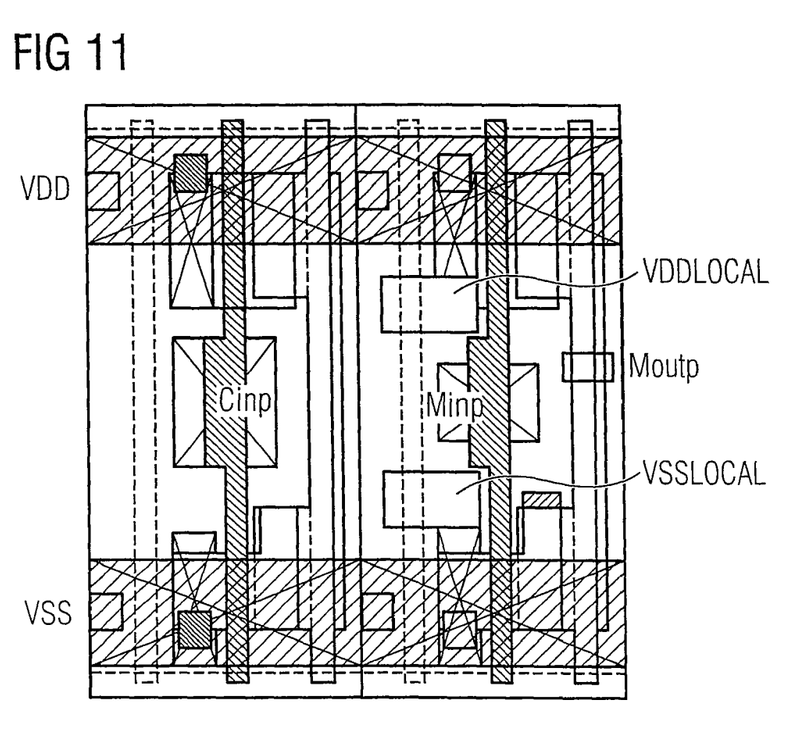
FIG. 11 shows an exemplary embodiment of a layout of inverting gates of the first oscillator and of the second oscillator.

FIG. 11 shows a layout with respect to the block diagram from FIG. 10. Vias are depicted as black squares and serve for connecting the first and the second potential VDD and VSS to the source terminals of the transistors P0 and N0. The terminals VDDLOCAL and VSSLOCAL identify the corresponding terminals of the transistors P1 and N1 and are embodied as metal 1 terminal regions or metal 1 pins. By virtue of the fact that the entire circuit is constructed by means of standard cells and a few modified delay cells, it is difficult to identify the circuit arrangement 1 for detecting voltage changes within the overall circuit, such that the latter is thereby protected against manipulations.

The invention claimed is:

1. A circuit arrangement for detecting voltage changes, comprising:
   supply terminals configured to apply a first potential and a second potential;
   a first oscillator and a second oscillator, which are operated with the first potential and the second potential, a voltage dependence of the frequency of the first oscillator differing from a voltage dependence of the frequency of the second oscillator;
   a first evaluation circuit configured to evaluate the frequency of the first oscillator and a second evaluation circuit configured to evaluate the frequency of the second oscillator; and
   a comparison circuit configured to compare a value based on the evaluated frequencies of the first oscillator and of the second oscillator with a predetermined threshold value, and to output a voltage change signal indicating an impermissible voltage change between the first potential and the second potential depending on the result of the comparison.

2. The circuit arrangement as claimed in claim 1, wherein
   the first oscillator has voltage stabilization circuits via which the first oscillator is connected to the first potential and the second potential, and
   the stabilization circuits are designed such that voltage changes between the first potential and the second potential affect the frequency of the first oscillator only to a reduced extent in comparison with the frequency of the second oscillator.

3. The circuit arrangement as claimed in claim 2, wherein each of the voltage stabilization circuits comprises a stabilization capacitor and a stabilization resistor connected in parallel.

4. The circuit arrangement as claimed in claim 1, wherein the second oscillator is directly connected to the first potential and the second potential.

5. The circuit arrangement as claimed in claim 2, wherein the first oscillator and the second oscillator are constructed with the same components apart from the voltage stabilization circuits.

6. The circuit arrangement as claimed in claim 1, wherein each of the first oscillator and the second oscillator comprises a ring oscillator having a feedback series circuit comprising an odd number of inverting gates.

7. The circuit arrangement as claimed in claim 6, wherein the inverting gates of the first oscillator and the inverting gates of the second oscillator are arranged in direct spatial proximity.

8. The circuit arrangement as claimed in claim 1, wherein the first evaluation circuit is a first counter and the second evaluation circuit is a second counter, the first counter outputting a first counter reading and the second counter outputting a second counter reading.

9. The circuit arrangement as claimed in claim 1, further comprising a further circuit, which is clocked with a system clock, is operated with the same first potential and the same second potential as the circuit arrangement, and is put into a predetermined state when the voltage change signal is output by the circuit arrangement.

10. The circuit arrangement as claimed in claim 9, wherein the predetermined state of the circuit is a reset state, an initialization state or an inhibit state.

11. The circuit arrangement as claimed in claim 9, wherein the frequency of the first oscillator is at least eight times greater than the frequency of the system clock of the circuit.

12. The circuit arrangement as claimed in claim 8, wherein the comparison circuit has a subtractor configured to calculate a difference between the counter reading of the first counter and the counter reading of the second counter.

13. The circuit arrangement as claimed in claim 12, wherein once during a predetermined number of system clock cycles,
   the outputting of oscillator signals of the first oscillator and of the second oscillator is switched off,
   the difference between the counter readings of the first and of the second counter is forwarded to a comparator,
   the difference between the counter readings is compared with a predetermined threshold value in the comparator, and
   a voltage change signal is output for putting the circuit into a predetermined state if the difference is greater than the threshold value.

14. The circuit arrangement as claimed in claim 13, wherein after the comparison of the difference between the counter readings with the threshold value,
   the counter readings of the first counter and of the second counter are reset, and the outputting of oscillator signals of the first oscillator and of the second oscillator is switched on.

15. The circuit arrangement as claimed in claim 14, further comprising a drive circuit configured to control the outputting of the oscillator signals and the resetting of the counter readings in a manner dependent on the system clock of the circuit.

16. The circuit arrangement as claimed in claim 1, wherein the circuit arrangement comprises:
a second circuit arrangement as also claimed in claim 1,
wherein the first evaluation circuit of the second circuit arrangement is a first counter and the second evaluation circuit is a second counter, the first counter outputting a first counter reading and the second counter outputting a second counter reading, and
wherein the second circuit arrangement detects voltage changes if, in the first circuit arrangement the outputting of oscillator signals of the first and of the second oscillator has been switched off or the counter readings of the first and of the second counter are in the reset state.

17. The circuit arrangement as claimed in claim 8, wherein the first counter outputs a first counter signal, which
causes the second oscillator to output an oscillator signal until the first counter reading reaches a first count, and
prevents the outputting of an oscillator signal of the second oscillator when the first count is exceeded by the first counter reading.

18. The circuit arrangement as claimed in claim 17, wherein the first oscillator outputs an oscillator signal in an uninterrupted manner.

19. The circuit arrangement as claimed in claim 18, wherein the first counter outputs a second counter signal when the first counter reading reaches a second count, said second counter signal triggering the comparison of the counter reading of the second counter with a predetermined value in a comparator in the comparison circuit, the second count being greater than the first count.

20. The circuit arrangement as claimed in claim 19, wherein the first counter outputs a third counter signal when the first counter reading reaches a third count, said third counter signal forwarding the result of the comparison in the comparator as voltage change signal to the circuit, the third count being greater than the second count.

21. The circuit arrangement as claimed in claim 20, wherein the third counter signal resets the counter readings of the first counter and of the second counter.

22. The circuit arrangement as claimed in claim 19, wherein the first count and the second count are chosen such that enough time is available for a stable counter reading of the second counter to be present at the comparator.

23. The circuit arrangement as claimed in claim 20, wherein the second count and the third count are chosen such that enough time is available for a stable voltage change signal to be present at the comparator output.

24. The circuit arrangement as claimed in claim 20, wherein the third count is the largest countable counter reading of the first counter.

25. A method for detecting a voltage change, comprising:
generating a first and a second frequency from a voltage, wherein the first frequency has a lower voltage dependence than the second frequency,
evaluating the first frequency and the second frequency; and
outputting a voltage change signal if the evaluated first frequency and the evaluated second frequency differ from one another by more than a predetermined threshold value, or the evaluated second frequency lies below a predetermined threshold value after a time predetermined by the evaluated first frequency.

* * * * *